United States Patent [19]
Oliver et al.

[11] Patent Number: 6,012,031
[45] Date of Patent: Jan. 4, 2000

[54] VARIABLE-LENGTH MOVING-AVERAGE FILTER

[75] Inventors: Richard J. Oliver, Laguna Beach; Paul M. Embree, Irvine; Casper William Barnes, Murrieta, all of Calif.

[73] Assignees: Sony Corporation; Sony Electronics

[21] Appl. No.: 08/958,596

[22] Filed: Oct. 29, 1997

Related U.S. Application Data

[63] Continuation of application No. 08/937,136, Sep. 24, 1997, abandoned.

[51] Int. Cl.[7] .................................................. G10L 3/00
[52] U.S. Cl. ................................. 704/500; 704/503
[58] Field of Search .................................. 704/500, 501, 704/502, 503, 229, 203, 200, 201

[56] References Cited

U.S. PATENT DOCUMENTS

| 4,802,222 | 1/1989 | Weaver | 704/203 |
|---|---|---|---|
| 5,649,054 | 7/1997 | Onmen et al. | 704/229 |
| 5,761,642 | 6/1998 | Suzuki et al. | 704/503 |

*Primary Examiner*—Richemond Dorvil
*Attorney, Agent, or Firm*—Fulwider Patton Lee & Utecht

[57] ABSTRACT

A filter for a system for processing audio samples, which dynamically vaires its length responsive to a moving average of variations in an audio input rate. The filter lengthens at substantially constant input rate variations to reduce input noise, and shortens at rapid input rate variations to enhance responsiveness.

6 Claims, 2 Drawing Sheets

CONSTANT (MOVING AVERAGE)

GAUSSIAN
(OR GENERAL FIR)

VARIABLE-LENGTH MOVING-AVERAGE FILTER

RELATED APPLICATION

This application is a continuation of application Ser. No. 08/937,136, filed Sep. 24, 1997, now abandoned.

BACKGROUND OF THE INVENTION

1. Field of the Invention

The present invention relates generally to filters. It relates more particularly to a filter which has a length which varies dependent on a variable audio sample input rate.

2. Art Background

Filters have been used to filter noisy inputs in systems for processing signals. In a device such as an audio player and recorder for media playback and recording, which includes a system for processing the motion imparted by a user to an audio input to generate an audio sample rate output for controlling the motion of an audio transport, the audio input may be noisy. The noisy input may be due to an audio ripple resulting from the aliasing effect of a wow from motion variations imparted by the audio input user in speeding up, slowing down, speeding up, slowing down, and the like.

A filter may be implemented to filter the noisy input. The filter needs to be long enough to eliminate the input noise. Some specialized filters may be implemented to be long enough to eliminate the input noise. Such specialized filters may include a multiplicity of tap points, which may be computationally very intensive, requiring as many multiplies as there are tap points on the filter, which, for a filter with a multiplicity of tap points, would require a substantial number of multiplies. If the specialized filter is implemented with a constant gain, by averaging the sample values over the length of the filter, so as to generate coefficients of the filter equal to each other and constant, which are convolved at the input in an averaging calculation over the same number of samples to obtain the output, no multiplies are required. This can be implemented by a circular buffer and an accumulator. In such implementation, each time a sample is put into the circular buffer, the new sample value is added to the accumulator, and the oldest samples are taken out and their values are subtracted from the accumulator. The output of the filter is the accumulated sum of all the sample values divided by the length of the filter. This implementation is a computationally efficient version of a filter, in that regardless of how long it is, all it requires is an addition and a divide to calculate the filter. However, such a filter needs to be lengthened in order to attenuate the higher frequencies, requiring a longer buffer of samples to keep track of.

However, lengthening the filter may add a delay to the system which, along with the delay in the system imparted by a network for processing the signal, may make the system unresponsive, even if the processing time is sufficient to implement the filter. Also, the filter implementation may not run fast enough to run in real time, with the numerous other businesses running in the system.

Therefore, there has been a need existing for a filter which varies its length in response to a variable audio sample input rate, without an accumulator, to filter input noise. The present invention fulfills those needs.

SUMMARY OF THE INVENTION

Briefly and in general terms, the present invention provides a filter which dynamically varies its length responsive to a moving average of variations in an input rate.

The filter includes a circular buffer including a plurality of positions for storing audio sample values during iteration of the processing system, and means for adding an audio sample to the buffer upon each iteration of the processing system. The filter further includes means for generating an audio sample value for each position in the circular buffer upon each iteration of the processing system, wherein the audio sample value comprises the sum of the audio sample added to the position and the audio sample stored in the prior position. The filter still further includes means for generating a calculated average of the plurality of audio sample values stored in the positions in the buffer, and means for changing the length of the filter responsive to the calculated average.

One aspect of the present invention is that the filter lengthens at substantially constant input rate variations to reduce input noise.

Another aspect of the present invention is that the filter shortens at rapid input rate variations to enhance responsiveness.

Other features and advantages of the invention will become apparent from the following detailed description taken in conjunction with the accompanying drawings, which illustrate, by way of example, the features of the invention.

DETAILED DESCRIPTION OF THE PREFERRED EMBODIMENTS

Figure 1:
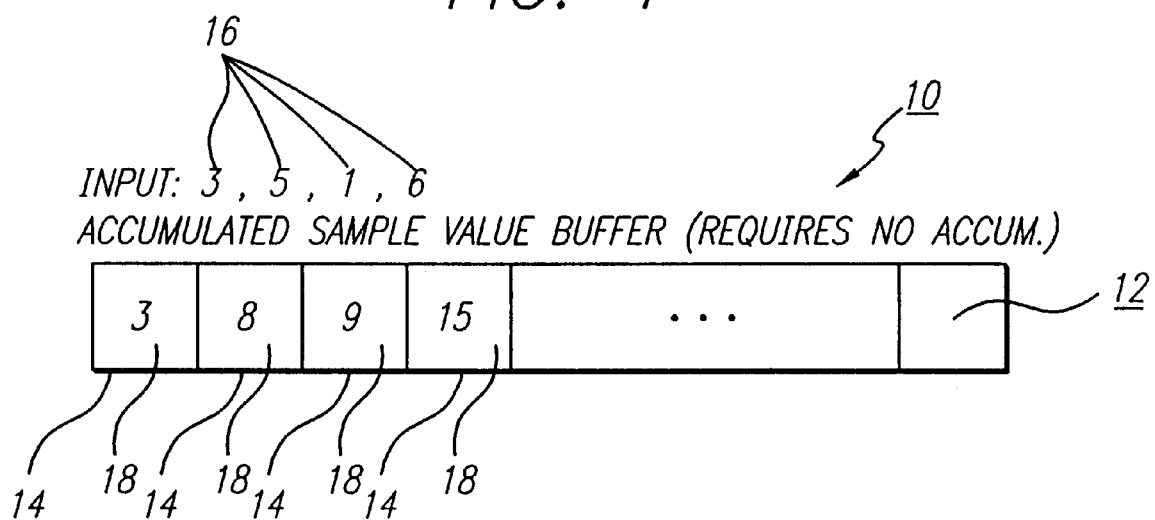
FIG. 1 is a diagram illustrating circular buffer for accumulated sample values in accordance with the present invention.

Referring now to the drawings, and in particular to FIG. 1, there is shown a filter 10, comprising a circular buffer 12 which includes a plurality of positions 14 and a plurality of values 16 of audio samples 18 in positions 14.

Circular buffer 12 in the embodiment of the invention as shown in FIG. 1, stores the accumulated sum of all the audio samples 18 received by filter 10 and stored in an audio sample buffer 12, as accumulated audio sample values 16. The accumulated value buffer 12 includes a word length sufficiently long to prevent the overflow of values 16. To derive the average value in the buffer from the latest sample back, the number of samples back to be averaged is selected. For example, audio sample inputs 18 of value 3, 5, 1 and 6 to be stored in the audio sample buffer 12, are stored in the accumulated audio sample buffer 12 as inputs as follows: The first input sample 18 of value 3 is stored in the first buffer position 14. Then the next input sample 18 of value 5 is added to the prior stored sample value 3 to generate an accumulated input of value 8, which is stored in the next buffer position 14. Then the next input sample 18 of value 1 is added to the prior stored accumulated value 8 to generate an accumulated value of 9 which is stored in the next buffer position 14. Then the next input sample 18 of value 6 is added to the prior stored accumulated sample value of 9 to generate an accumulated sample value of 15 which is stored in the next buffer position 14.

To derive the average accumulated value, for example, for the last three samples 18 of value 5, 1, and 6, input into buffer 12, the accumulated value three sample back, 3, is subtracted from the last accumulated value, 15, generating a 12, which is divided by the number of samples being averaged, 3, generating an average accumulated value of 4. That average, 4, is consistent with the average derived by adding the last three sample values in the buffer, 5, 1, and 6, generating a 12, and dividing by the number of samples being averaged, 3.

The average accumulated value in buffer 12 can be derived by looking at the current sample of interest, going back any distance in the buffer, calculating the difference of accumulated values between those two positions in the buffer, and dividing by the distance in the buffer, to efficiently and effectively compute the output of the moving average filter, to dynamically change the filter length as required without storing sample values in separate accumulators.

Figure 2:
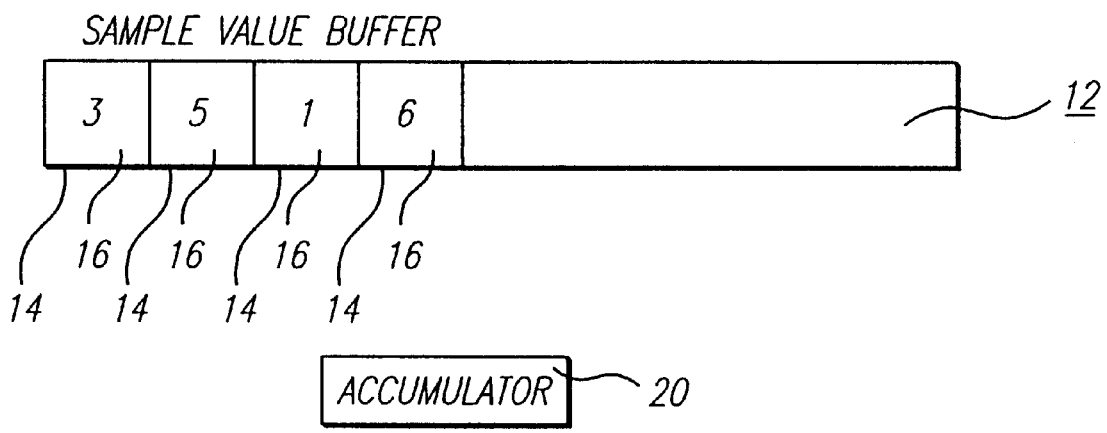
FIG. 2 is a diagram illustrating an embodiment of a circular buffer for sample values and accumulators, in accordance with the prior art.
Figure 3:
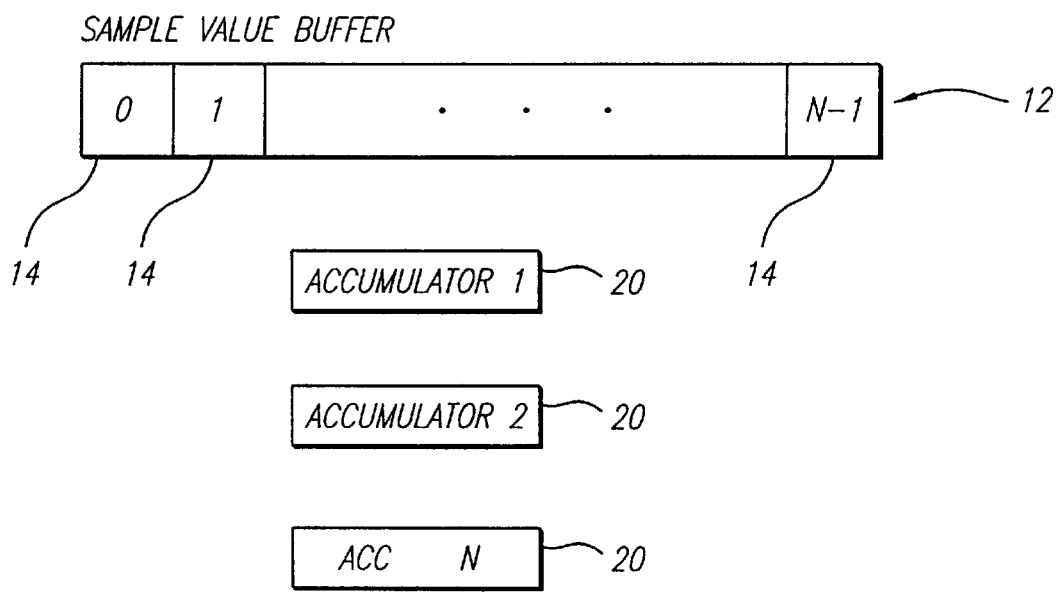
FIG. 3 is a diagram illustrating an embodiment of a circular buffer for sample values and accumulators, in accordance with the prior art.
Figure 4:
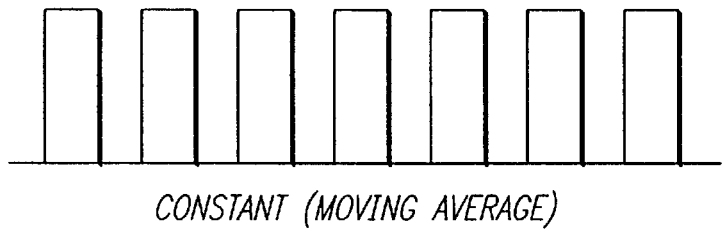
FIG. 4 is a graph of coefficients of sample values in a constant moving average filter.
Figure 5:
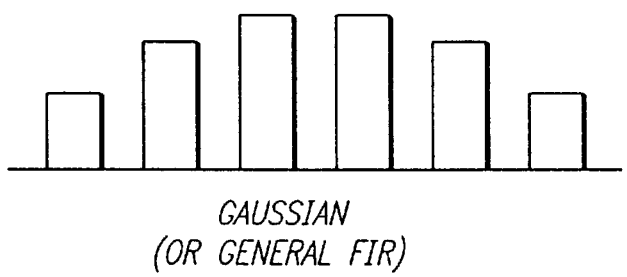
FIG. 5 is a graph of coefficients of sample values in a Gaussian filter.

Moving average filters 10 in the prior art as illustrated in FIG. 2 and 3 include a circular buffer of length N, where N is the number of taps on the filter, and one accumulator 20 in FIG. 2 and a plurality of accumulators 20 in FIG. 3 that keep a running average of all the sample values in buffer 12. To change the length of moving average filter 10, a separate accumulator 20 would be needed for each length, or an accumulator 20 to store all the sample averages. For example, to change the filter length from 1 to N or any value in between, a plurality of accumulators 20 for storing average values could include a plurality of accumulators 20 that accumulate sample values, specifically accumulator 1, which accumulates the last sample value, accumulator 2, which accumulates the last two samples values, through an accumulator N that accumulates the last N sample values. To dynamically change the filter length, each of the N accumulators 20 would have to be accumulated for each sample period, which, particularly for a long filter, requires a substantial amount of computation. To calculate the output for the entire buffer 12, every value in the whole buffer 12 must be added.

To implement a moving-average filter 10, input samples 16 are stored in circular buffer 12 and a separate accumulated sample value 20 is kept that is equal to the sum of sample values 16 in buffer 12. Each sample period, a new sample 16 is input into buffer 12, and its value is added to the accumulated value; at the same time, the oldest sample 16 is removed from buffer 12 and its value is subtracted from the accumulated value. The output of filter 10 is the accumulated sample value divided by the length of buffer 12.

The present invention stores in the circular buffer 12 the accumulated sum of all input sample values 16 to date, not the value of each input sample 16, by adding the new input sample value to the previous value that was stored in buffer 12, and storing this sum into the next buffer position 14. Then the output average is derived by taking the difference between the new input to buffer 12 and the oldest value in buffer 12, and dividing by the buffer length; there is no separate accumulator. The average can be calculated for any length filter 10 at any time, up to the full length of buffer 12, such that a controller can dynamically choose the filter length without adding any overhead to the filter calculations. To do this in the prior art required storing one accumulated value for every possible filter length, and updating each of the accumulators every sample period, substantially compromising the computational benefits of the moving average filter.

By limiting filter length selection to powers of two, the division by buffer length can be accomplished by shifting the word instead of doing a divide. Also, the word size of the buffer should be chosen to be large enough to represent the accumulated values of all samples in the buffer without overflowing. In general, the word size should be at least the size of the input samples plus enough bits to represent the full length of the buffer.

The input and output of filter 10 represent positional information, but the controlling parameter for selecting the filter length is the input rate, not position. To derive a rate, the current length of filter 10 may be split into two equal parts and each part treated as a positional filter (one giving the current position and one giving a delayed position) and the positional difference divided by the time difference to get the rate. In addition to being able to change the length of the filter dynamically, the position in time can be changed as well, as long as the selected delay plus filter length do not exceed the full length of the buffer.

Storing accumulated values in the filter buffer instead of direct sample values can be extended to two or more dimensions. For example, a two-dimensional image indexed as (x,y) coordinates could be stored with each point being the sum of the pixel values in the rectangle with corners at (0,0) and (x,y). Then the average value for any rectangle in the image could quickly be calculated by subtracting the value stored at the corner of the rectangle with the lowest (x,y) coordinates from the value stored at the corner with the highest coordinates, and dividing by the number of pixels in the rectangle. This average could then be used to process the image by low-pass filtering, creating a mosaic effect, etc.

A functional description of the variable-length moving-average filter of the present invention is included in the attached Appendix A.

While this invention has been particularly described with reference to a preferred embodiment thereof, it will be understood by one skilled in the art that the present system may be practiced without many of the specific details disclosed above, and that changes in the above description or illustrations may be made with respect to form or detail without departing from the spirit and scope of the invention.

APPENDIX A

```
// NAME
//    rate.cpp
//
// DESCRIPTION
//    Interface to the AES reference time.
//
// COPYRIGHT
//    Copyright 1996 by Advanced Digital Systems Group, All rights reserved.
//
// VERSION CONTROL
//    $Header:   G:/PVCS/ARCHIVES/TPRTDLL/rate.cpv   1.23   Aug 15 1997 15:52:40   jclaar  $
// include "precomp.h"
include <rate.hpp> include <aesiface.hpp>
include <registry.hpp>
#include <regkeys.h>
#include <syminmax.hpp>
#include <textern.h>

//
// FOLLOWING IS THE NEW FILTER IMPLEMENTATION, WHICH IS BASED ON THIS PSEUDO-CODE
//
// First stage (sample frame number)
//    frameSamplePeriod should be <= nominalFramePeriod
//    frameUpdatePeriod = vitcTypeUpdate && kWorstCaseHardwareUpdateTime < nominalFramPeriod ?
//       nominalFramePeriod : kWorstCaseHardwareUpdateTime
//    minForwardFilterDepth = log2((frameUpdatePeriod + minForwardFilterLength) / frameSamplePeriod) + 2
//    minReverseFilterDepth = log2((frameUpdatePeriod + minReverseFilterLength) / frameSamplePeriod) + 2
//    every frameSamplePeriod (can use waitTime as a delay)
//       read beforeSampleNumber
//       read inputFrameNumber
//       read afterSampleNumber
//       inputSampleNumber = captureTimeVaries ? (beforeSampleNumber + afterSampleNumber) >> 1 : beforeS
// ampleNumber
// Second stage (lowpass filter)
//    static samplePeriods = 0
//    static currentPosition = 0
//    static filterDepthLimit = 1 << kMaxFilterDepth
//    static pass = 0
//    static filterArray[(1 << kMaxFilterDepth) + 1]    // Initialize frames starting at 0, spaced apart b
// y initialFrameNumber
//                                                      // Initialize samples starting at 0, spaced apart
// by frameSamplePeriod
//    filterRate[kMaxFilterDepth+1]
//    newSamplePeriods = (currentTime + (frameSamplePeriod >> 1) - lastIterateTime) / frameSamplePeriod
//    if (kExternalFrameClock)
//       if (newSamplePeriods > 0)
//          lastIterateTime = currentTime
//    else
//       lastIterateTime += newSamplePeriods * frameSamplePeriod
//    waitTime = lastIterateTime + frameSamplePeriod - currentTime
//    samplePeriods += newSamplePeriods
//    if (samplePeriods == 0 || newSamplePeriods > 1)
//       return waitTime
//    lastPoint = mFilterArray[currentPosition - 1] - mFilterArray[mCurrentPosition - 2]
//    for (j = 1; j <= samplePeriods; j++)      // optimize loop for the case j == samplePeriods
//       filterArray[currentPosition].frame = filterArray[currentPosition - 1].frame +
//          lastPoint.frame + (j * (inputFrameNumber - lastPoint.frame)) / samplePeriods
//       filterArray[currentPosition].sample = filterArray[currentPosition - 1].sample +
//          lastPoint.sample + (j * (inputSampleNumber - lastPoint.sample)) / samplePeriods
//       // determine the minimum filter depth based on whether we're going forward or backward
//       minFilterDepth = max(minForwardFilterDepth, minReverseFilterDepth)
//       minFilterDepth = filterArray[currentPosition].frame +
//          filterArray[currentPosition - (1 << minFilterDepth)].frame -
//          (filterArray[currentPosition - (1 << minFilterDepth - 1)].frame << 1) >= 0 ?
//          minForwardFilterDepth : minReverseFilterDepth
//       // calculate rate in frames/period (really use fixed point)
//       rate = filterArray[currentPosition] + filterArray[currentPosition - (1 << minFilterDepth)] -
//          (filterArray[currentPosition - (1 << minFilterDepth - 1)] << 1) >> 2
//       for (currentFilterDepth = kMaxFilterDepth, i = minFilterDepth; i <= kMaxFilterDepth; i++)
//          filterRate[i] = filterArray[currentPosition] + filterArray[currentPosition - (1 << i)] -
//             (filterArray[currentPosition - (1 << i - 1)] << 1)
//          // the following rate compare adds the variance in frameSamplePeriod to the variance in the
// input frame rate
//          // if the variance in frameSamplePeriod is significant, rate should be calculated by dividin
// g the difference
//          // in frame numbers by the difference in sample numbers
//          if (currentFilterDepth == kMaxFilterDepth && abs(rate.frame << 2 - filterRate[i].frame) > (5
//    << i) >> 2) // never true for i==minFilterDepth
//             currentFilterDepth = i - 1
```

```
//          rate = filterRate[i]
//      if (1 << currentFilterDepth < mFilterDepthLimit)
//          filterDepthLimit = 1 << currentFilterDepth
//          while (1 << currentFilterDepth > filterDepthLimit) // limit increase in depth to prevent usage
//  of "stable" filter that actually
//              currentFilterDepth--                           // has equal but opposite transients passing
//  through it
//      if (filterDepthLimit < 1 << kMaxFilterDepth)
//          filterDepthLimit++
//      if (++pass == kDecimate)
//          filterPipe.PutItem(filterArray[currentPosition] - filterArray[currentPosition - (1 << curren
tFilterDepth)] +
//              (filterRate[currentFilterDepth] << 1) >> currentFilterDepth,.
//              filterRate[currentFilterDepth] * kDecimate >> (currentFilterDepth - 1 << 1))
//          pass = 0
//          currentPosition++      // modulo size of filterArray[] (use double-size filterArray, enter val
ues twice)
//      samplePeriods = 0
//      return waitTime
// Third stage (frame tracker)
//      wait while filterPipe is empty
//      filterOutput = filterPipe.GetItem()
//      newFrameNumber = filterOutput.frame
//      newSampleNumber = filterOutput.sample
//      newRateFrameDelta = filterOutput.rate.frame
//      newRateSampleDelta = filterOutput.rate.sample
//      get commandTimeStamp at which a rate command sent this iteration will take effect
//      rateTimeStamp = commandTimeStamp
//      if (rateTimeStamp < cueTimeStamp)
//          rateTimeStamp = cueTimeStamp
//      nextRateTimeStamp = commandTimeStamp + newRateSampleDelta
//      currentRate = newRateFrameDelta * samplesPerFrame / newRateSampleDelta
//      position = actualPosition + lastActualRate * (rateTimeStamp - lastActualRateTimeStamp)
//      desiredNextPosition = newFrameNumber * samplesPerFrame + currentRate * (nextRateTimeStamp - newSam
pleNumber)
//      newRate = (desiredNextPosition - position) / (nextRateTimeStamp - rateTimeStamp)
// Fourth stage (transport control)
//      desiredPosition = newFrameNumber * samplesPerFrame + currentRate * (rateTimeStamp - newSampleNumbe
r)
//      error = abs(desiredPosition - position)
//      // FF and REW should not be implemented at this level--instead, kMaxRate should be set to somethin
g higher than
//      // the FF/REW rate and the transport should do something like periodically stop/cue/play to simula
te CD-type shuttling
//      if (newRate > kMaxRate)
//          newRate = kMaxRate
//      if (newRate < -kMaxRate)
//          newRate = -kMaxRate
//      rateTolerance = ((kMaxUnityError / samplesPerFrame) * nominalFramePeriod) / (frameSamplePeriod * k
Decimate)
//      kSyncWindowFactor = 8    // Use tighter rate & position windows before locking into unity speed
//      if (newRate > 1.0 - rateTolerance && newRate < 1.0 + rateTolerance && error < kMaxUnityError)
//          if (unityRateTimer < forwardSyncLockDelay)
//              if (newRate > 1.0 - rateTolerance / kSyncWindowFactor &&
//                  newRate < 1.0 + rateTolerance / kSyncWindowFactor && error < kMaxUnityError / kSyncWindowFa
ctor)
//                  unityRateTimer++
//          else
//              newRate = 1.0
//      else if (newRate < -1.0 + rateTolerance && newRate > -1.0 - rateTolerance && error < kMaxUnityErro
r)
//          if (unityRateTimer > reverseSyncLockDelay)
//              if (newRate < -1.0 + rateTolerance / kSyncWindowFactor &&
//                  newRate > -1.0 - rateTolerance / kSyncWindowFactor && error < kMaxUnityError / kSyncWindowF
actor)
//                  unityRateTimer--
//          else
//              newRate = -1.0
//      else
//          unityRateTimer = 0
//      currentRateCueHint = (currentRate <= 0 ? kBackward : 0) | (currentRate >= 0 ? kForward : 0)
//      if (error > kMaxChaseError && abs(newRate) == kMaxRate || cueHint != kBidirectional && currentRate
CueHint & ~cueHint)
//          cueHint = currentRateCueHint
//          cueSettleTime = kCueSettleTime << (cueHint == kBidirectional)
//          if (cueSettleTime < newRateSampleDelta)
//              cueSettleTime = newRateSampleDelta
//          cueTimeStamp = commandTimeStamp + cueSettleTime
//          newRate = 0
//      if (newRate != lastActualRate)
//          set transport rate to newRate at commandTimeStamp with zero lock
//          position = newFrameNumber * samplesPerFrame + currentRate * (cueTimeStamp - newSampleNumber)
//          cue transport to position at commandTimeStamp with cueHint
//          cuePosition = position
//      else if (commandTimeStamp + newRateFilterDelta >= cueTimeStamp)
```

```
//      lock = (unityRateTimer == forwardSyncLockDelay || unityRateTimer == reverseSyncLockDelay) && ab
//         s(newRate) == 1.0
//         if (newRate != lastActualRate || lock != lastActualLock)
//            set transport rate to newRate at rateTimeStamp with lock
//         cueTimeStamp = rateTimeStamp
//         if (cueHint != kBidirectional)
//            if (position >= cuePosition + kCueSettleTime)
//               cueHint |= kBackward
//            else if (position <= cuePosition - kCueSettleTime)
//               cueHint |= kForward
// Upon receipt of a transport rate command
//    actualPosition += lastActualRate * (cmd.mTimeStamp - lastActualRateTimeStamp)
//    lastActualRate = cmd.mRate
//    lastActualRateTimeStamp = cmd.mTimeStamp
//    lastActualLock = cmd.mLock
// Upon receipt of a transport cue command
//    actualPosition = cmd.mCue.mTime
//    lastActualRateTimeStamp = cmd.mTimeStamp
// static const Int16 INFINITE_SYNCLOCK_DELAY    = 0x7FFF;

SyNewRateControl::SyNewRateControl
(
    IEEE32 sampleRate,                      // Samples/second
    IEEE32 nominalFramePeriod,              // Milliseconds/frame for this type of time code at unity r
       ate
    Bool32 vitcTypeUpdate,                  // TRUE iff frame numbers change only on nominal frame peri
       od boundaries
    UInt32 forwardSyncLockDelay,            // Time in ms over which timecode rate must stay at play sp
       eed before a play command is issued
    UInt32 reverseSyncLockDelay,            // Time in ms over which timecode rate must stay at play re
       verse speed before a play reverse command is issued
    UInt32 minForwardFilterLength,          // Period in ms over which average timecode rate is stable
       in the forward direction
    UInt32 minReverseFilterLength,          // Period in ms over which average timecode rate is stable
       in the reverse direction
    UInt32 frameSamplePeriod ,              // Period between calls to CalculateRate(), should be <= no
       minalFramePeriod
    Bool32 externalFrameSampleClock,        // TRUE iff period between calls to CalculateRate is driven
       by external clock
    IEEE32 maxFrameSamplePeriodVariance,    // Ideally less than half of frameSamplePeriod (see note in
       FilterFrameNumber())
    IEEE32 captureDelay,                    // ms between H/W capture of frame number and middle of Cur
       rentFrameNumber() call
    Bool32 captureTimeVaries,               // TRUE iff call to CurrentFrameNumber() take a variable am
       ount of time
    Bool32 throwAwayLateFilterPoints,       // TRUE if late calls to CalculateRate can happen, FALSE if
       calls to CalculateRate
                                            // might be skipped but will not affect subsequent calls
    Bool32 correctForFilterDelay,           // TRUE if the output should be adjusted to correct for the
       positional
                                            // (time) delay through the filter; generally TRUE for time
       code filters
                                            // (so they lock at the right position) and FALSE for jog f
       ilters
    UInt16 decimationFactor,                // Transport rate will be updated every decimationFactor*fr
       ameSamplePeriod ms
    Int32 priority,                         // Should be no higher than the thread that calls Calculate
       Rate(), or
                                            // accuracy of CalculateRate()'s return value may be advers
       ely affected
    IEEE32 worstCaseHardwareUpdateTime,     // Max time for hardware to update frame number when input
       time code changes
    IEEE32 maxRate,                         // Max +/- rate at which we can move the transport (default
       +12.5% varispeed)
    IEEE32 maxUnityError,                   // Maximum number of frames we can be off by and still main
       tain "unity" rate
    IEEE32 maxChaseError,                   // Maximum number of frames we can be off while chasing bef
       ore cueing to catch up
    UInt16 maxFilterDepth,                  // Length of the longest FIR filter will be 1 << maxFilterD
       epth
    UInt32 pipeDepth                        // Depth of sync pipe used to pass decimated filter points
       to output stage
) :
    SyTask(NULL, NULL, 0, TRUE, INFINITE, TRUE, priority),
    kSamplesPerMillisecond(sampleRate / 1000.0),
    mFrameUpdatePeriod
    (
        (
            vitcTypeUpdate && worstCaseHardwareUpdateTime < nominalFramePeriod
        ?
            nominalFramePeriod
        :
            worstCaseHardwareUpdateTime
```

```
        )
        +
        maxFrameSamplePeriodVariance
        ),
        kFrameSamplePeriod(frameSamplePeriod),
        kExternalFrameSampleClock(externalFrameSampleClock),
        kCaptureDelay(captureDelay * sampleRate / 1000.f),
        kCaptureTimeVaries(captureTimeVaries),
        kThrowAwayLateFilterPoints(throwAwayLateFilterPoints),
        mCorrectForFilterDelay(correctForFilterDelay),
        kMaxFilterDepth(maxFilterDepth),
        kDecimate(decimationFactor),
        mFilterArray(new SyFilterPoint[1 << maxFilterDepth + 1]),    // Double the size of the array to simpli
                fy indexing
        mFilterRate(new SyFilterPoint[maxFilterDepth + 1]),
        mFilterPipe(pipeDepth),
        kMaxRate(maxRate),
        kRateTolerance((maxUnityError * nominalFramePeriod) / (frameSamplePeriod * decimationFactor)),
        kMaxUnityError(maxUnityError * nominalFramePeriod * sampleRate / 1000.0),
        kMaxChaseError(maxChaseError * nominalFramePeriod * sampleRate / 1000.0),
        kRatePrecisionThreshold(5 * nominalFramePeriod * sampleRate / 1000.0),
        IterateFrameFilter(&SyNewRateControl::InitIterateFrameFilter),
        mTimeCodeAnchor(kInvalidAESTime)
{
        // Set the minimum filter depths and sync lock delays
        this->UpdateForwardFilterLength(minForwardFilterLength);
        this->UpdateReverseFilterLength(minReverseFilterLength);
        this->UpdateForwardSyncLockDelay(forwardSyncLockDelay);
        this->UpdateReverseSyncLockDelay(reverseSyncLockDelay);

// Initialize the critical section
        ::SyInitializeCriticalSection(&mTransportCS);

// Set system timer resolution for SyTimeGetTime()
        UInt32 maxResolution;
        ::SyTimeGetDevCaps(&mTimerResolution, &maxResolution);
        ::SyTimeBeginPeriod(mTimerResolution);

// Add pipe empty semaphore to the base SyTask wait list and start the task
        this->AddObject(((SySemaphoreSemaphore*)mFilterPipe.EmptySemaphore())->GetHandle());
        this->Start();
}

//#define _DEBUG_BCD
#ifdef _DEBUG_BCD
extern UInt32 gBCDSize;
extern UInt32 gBCDCount;
extern UInt8 gBCD[][4];
extern TimeCode gTimeCode[];

Int32 gTimeStamp[1000];
#endif

SyNewRateControl::~SyNewRateControl(void)
{
        // Shut down the transport control task
        this->Kill();

#ifdef _DEBUG_BCD
        for (UInt32 i = gBCDCount; i < gBCDSize; i++)
        {
                SYRELTRACE(_T("%c%c:%c%c:%c%c:%c%c          %I64d"),
                        (gBCD[i][3] >> 4 & 0xF) + _T('0'),
                        (gBCD[i][3] & 0xF) + _T('0'),
                        (gBCD[i][2] >> 4 & 0xF) + _T('0'),
                        (gBCD[i][2] & 0xF) + _T('0'),
                        (gBCD[i][1] >> 4 & 0xF) + _T('0'),
                        (gBCD[i][1] & 0xF) + _T('0'),
                        (gBCD[i][0] >> 4 & 0xF) + _T('0'),
                        (gBCD[i][0] & 0xF) + _T('0'),
                        gTimeCode[i]);
                SYRELTRACE(_T("          %ld\n"), gTimeStamp[i]);
        }
        for (i = 0; i < gBCDCount; i++)
        {
                SYRELTRACE(_T("%c%c:%c%c:%c%c:%c%c          %I64d"),
                        (gBCD[i][3] >> 4 & 0xF) + _T('0'),
                        (gBCD[i][3] & 0xF) + _T('0'),
                        (gBCD[i][2] >> 4 & 0xF) + _T('0'),
                        (gBCD[i][2] & 0xF) + _T('0'),
                        (gBCD[i][1] >> 4 & 0xF) + _T('0'),
                        (gBCD[i][1] & 0xF) + _T('0'),
                        (gBCD[i][0] >> 4 & 0xF) + _T('0'),
                        (gBCD[i][0] & 0xF) + _T('0'),
                        gTimeCode[i]);
```

```
        SYRELTRACE(_T("        %ld\n"), gTimeStamp[i]);
    }
endif
    // Undo timer resolution setting
    ::SyTimeEndPeriod(mTimerResolution);

// Delete the critical section
    ::SyDeleteCriticalSection(&mTransportCS);

// Free up the filter arrays
    delete[] mFilterRate;
    delete[] mFilterArray;
}

UInt32 SyNewRateControl::CalculateRate(void)
{
    //
    // Call functions which perform the first stage (sample the time code) and second stage
    // (filter the time code) of rate processing, as well as send decimated data to the third stage
    //
    return (this->*IterateFrameFilter)(this->GetFrameNumber());
}

UInt32 SyNewRateControl::Iterate(Int16)
{
    // Local variables for the third and fourth stages of the filter
    SyFilterPipeItem filterPoint;
    IEEE32 currentRate;
    IEEE32 newRate;
    TimeCode position;
    TimeStamp rateTimeStamp;
    TimeStamp commandTimeStamp;

// Release the empty semaphore because we waited on it in order to Iterate(), thereby artificially de
        crementing it
    mFilterPipe.EmptySemaphore()->Increment();

//
    // Get the decimated data from the second stage and call functions to peform the third stage
    // (track the time code) and fourth stage (control transport rate and cueing) of rate processing
    //
    mFilterPipe.GetItem(filterPoint);
    this->TrackFrames(filterPoint, currentRate, newRate, position, rateTimeStamp, commandTimeStamp);
    this->ControlTransport(filterPoint, currentRate, newRate, position, rateTimeStamp, commandTimeStamp);
    return 0;
}

SyFilterPoint SyNewRateControl::GetFrameNumber(void)
{
    //
    // Construct a filter point by reading the reference time, reading the time code, reading the
    // reference time again and averaging the two reference times
    //
    SyFilterPoint filterPoint;
    filterPoint.mSample = this->ExtendTimeStamp(this->GetReferenceTime());
#ifdef _TRACE_CAPTURE_TIME
    SYRELTRACE(_T("GFN:  timeOffsetBefore = %ld\n"), ::SyTimeGetTime() - (mLastIterateTime + kFrameSample
        Period));
#endif
    filterPoint.mFrame = this->CurrentFrameNumber();
    if (filterPoint.mSample != kInvalidAESTime)
    {
#ifdef _TRACE_CAPTURE_TIME
    SYRELTRACE(_T("GFN:  timeOffsetAfter = %ld\n"), ::SyTimeGetTime() - (mLastIterateTime + kFrameSampleP
        eriod));
#endif
        if (kCaptureTimeVaries)
        {
            TimeStamp timeStamp = this->GetReferenceTime();
            if (timeStamp != kInvalidAESTime)
            {
                filterPoint.mSample += this->ExtendTimeStamp(timeStamp);
                filterPoint.mSample >>= 1;
            }
        }
        filterPoint.mSample -= this->GetTimeStampDelay() - kCaptureDelay;
#ifdef _DEBUG_BCD
    static TimeStamp last = kInvalidAESTime;
    if (last != kInvalidAESTime)
    {
        gTimeStamp[gBCDCount++] = filterPoint.mSample - last;
        if (gBCDCount == gBCDSize)
        {
            /*
```

```
            for (UInt32 i = 0; i < gBCDSize; i++)
            {
                SYRELTRACE(_T("%c%c:%c%c:%c%c:%c%c          %I64d"),
                    (gBCD[i][3] >> 4 & 0xF) + _T('0'),
                    (gBCD[i][3] & 0xF) + _T('0'),
                    (gBCD[i][2] >> 4 & 0xF) + _T('0'),
                    (gBCD[i][2] & 0xF) + _T('0'),
                    (gBCD[i][1] >> 4 & 0xF) + _T('0'),
                    (gBCD[i][1] & 0xF) + _T('0'),
                    (gBCD[i][0] >> 4 & 0xF) + _T('0'),
                    (gBCD[i][0] & 0xF) + _T('0'),
                    gTimeCode[i]);
                SYRELTRACE(_T("          %ld\n"), gTimeStamp[i]);
            }
            */
            gBCDCount = 0;
            //::DebugBreak();
        }
        last = filterPoint.mSample;
#endif
    return filterPoint;
}

UInt32 SyNewRateControl::InitIterateFrameFilter(const SyFilterPoint& filterPoint)
{
    // Check for valid reference time
    if (filterPoint.mSample == kInvalidAESTime)
        return kFrameSamplePeriod;

// Initialize filter variables
    mLastIterateTime = ::SyTimeGetTime() - kFrameSamplePeriod;
    mSamplePeriods = 0;
    mFilterDepthLimit = 1 << kMaxFilterDepth;
    mPass = 0;
    mCurrentPosition = 0;
    mFilterArray[mCurrentPosition].mFrame = 0;
    mFilterArray[mCurrentPosition].mSample = 0;
    mFilterArray[mCurrentPosition + (1 << kMaxFilterDepth)] = mFilterArray[mCurrentPosition];
    for (mCurrentPosition++; mCurrentPosition < 1 << kMaxFilterDepth; mCurrentPosition++)
    {
        mFilterArray[mCurrentPosition].mFrame = mFilterArray[mCurrentPosition - 1].mFrame + filterPoint.mFrame;
        mFilterArray[mCurrentPosition].mSample = mFilterArray[mCurrentPosition - 1].mSample +
            filterPoint.mSample - kFrameSamplePeriod * kSamplesPerMillisecond * ((1 << kMaxFilterDepth) - mCurrentPosition);
        mFilterArray[mCurrentPosition + (1 << kMaxFilterDepth)] = mFilterArray[mCurrentPosition];
    }

// Initialize output stage variables here, also, so the timestamps will at least have reasonable values
    mCueTimeStamp = mLastActualRateTimeStamp = this->GetReferenceTime();
    mLastActualRate = 0.0;
    mLastActualLock = FALSE;
    mActualPosition = mCuePosition = this->TransportTime();
    //SYTRACE(_T("MAP set to %f\n"), (float) mActualPosition);
    mUnityRateTimer = 0;
    mCueHint = CUEHINT_BIDIRECTIONAL;

// Pass control for this and all future iterations to DoIterateFrameFilter()
    this->IterateFrameFilter = &SyNewRateControl::DoIterateFrameFilter;
    return this->DoIterateFrameFilter(filterPoint);
}

UInt32 SyNewRateControl::DoIterateFrameFilter(const SyFilterPoint& filterPoint)
{
    // Check for valid reference time
    if (filterPoint.mSample == kInvalidAESTime)
    {
        this->IterateFrameFilter = &SyNewRateControl::InitIterateFrameFilter;
        return kFrameSamplePeriod;
    }

// See how much time there is before the next iteration, and see if we've missed any iterations
    UInt32 time = ::SyTimeGetTime();
    UInt32 newSamplePeriods = (time + (kFrameSamplePeriod >> 1) - mLastIterateTime) / kFrameSamplePeriod;
    if (kExternalFrameSampleClock)
    {
        if (newSamplePeriods > 0)
            mLastIterateTime = time;
    }
    else
        mLastIterateTime += newSamplePeriods * kFrameSamplePeriod;
    Int32 waitTime = mLastIterateTime + kFrameSamplePeriod - time;
#ifdef _TRACE_ITERATE_TIME
```

```
        SYRELTRACE(_T("DIFF:  timeErr = %ld\n"), time - (mLastIterateTime + kFrameSamplePeriod));
#endif
        mSamplePeriods += newSamplePeriods;

// If the last iteration was too short or too long, don't use the current filter point
#ifdef _DEBUG
        static UInt32 total;
        static UInt16 number;
        static UInt16 period;
        if (newSamplePeriods > 1)
        {
            total += newSamplePeriods;
            number++;
            if (period == 0)
            {
                if (number == 1)
                    SYRELTRACE(_T("SyNewRateControl::IterateFrameFilter:  newSamplePeriods = %ld\n"), newSampleP
                eriods);
                else
                    SYRELTRACE(_T("SyNewRateControl::IterateFrameFilter:  total of %d newSamplePeriods = %ld\n")
                , number, total);
                total = 0;
                number = 0;
                period++;
            }
        }
        if (period != 0 && period++ == 100)
        {
            period = 0;
            if (number != 0)
            {
                if (number == 1)
                    SYRELTRACE(_T("SyNewRateControl::IterateFrameFilter:  newSamplePeriods = %ld\n"), total);
                else
                    SYRELTRACE(_T("SyNewRateControl::IterateFrameFilter:  total of %d newSamplePeriods = %ld\n")
                , number, total);
                total = 0;
                number = 0;
            }
        }
endif
        if (mSamplePeriods == 0 || (kThrowAwayLateFilterPoints && newSamplePeriods > 1))
            return waitTime;

// Put the new filter point into the frame filter (and construct fake filter points if we missed iter
        ations)
        SyFilterPoint lastPoint = mFilterArray[mCurrentPosition - 1] - mFilterArray[mCurrentPosition - 2];
        for (Int32 i = 1; i < mSamplePeriods; i++)
        {
            //
            // This loop should only execute if a previous iteration of getting the frame sample period
            // took too long.
            //
            SyFilterPoint fp;
            fp.mFrame = lastPoint.mFrame + (i * (filterPoint.mFrame - lastPoint.mFrame)) / mSamplePeriods;
            fp.mSample = lastPoint.mSample + (i * (filterPoint.mSample - lastPoint.mSample)) / mSamplePeriods;
            this->FilterFrameNumber(fp);
        }
        this->FilterFrameNumber(filterPoint);
        mSamplePeriods = 0;
        return waitTime;
} if defined(_DEBUG) || defined(NDEBUG)
SyFilterPipeItem::SyFilterPipeItem(const SyFilterPoint& filterPoint, const SyFilterPoint& rate, UInt16 d
        epth, UInt16 position) :
    SyFilterPoint(filterPoint),
    mRate(rate),
    mDepth(depth),
    mPosition(position)
{
}
else
SyFilterPipeItem::SyFilterPipeItem(const SyFilterPoint& filterPoint, const SyFilterPoint& rate) :
    SyFilterPoint(filterPoint),
    mRate(rate)
{
}
endif void SyNewRateControl::FilterFrameNumber(const SyFilterPoint& filterPoint)
{
    //
    // The values stored in mFilterArray[] are the cumulative sums of frame and sample numbers.  They are
        kept
```

```
// this way so that the sum of the frame/sample numbers between any two positions in the array can be
// determined by taking the difference between those two points, which in turn allows the average fra
me or
// sample number over that interval to be determined. This means that the values in mFilterArray[] w
ill
// periodically overflow the word size used to store the numbers, but this doesn't matter since we on
ly
// care about the difference between the values (provided the word size is large enough to represent
the
// cumulative frame/sample delta over (1 << kMaxFilterDepth) samples).
//
// The values stored in mFilterRate[] are shifted left by (filterDepth - 1 << 1); where filterDepth i
s the
// index into the array (e.g., mFilterRate[3].mFrame and mFilterRate[3].mSample are both sixteen time
s the
// actual frame number rate and sample number rate that is actually represented).
//

// Put the new filter point into the filter array
mFilterArray[mCurrentPosition] = mFilterArray[mCurrentPosition - 1] + filterPoint;

// Copy the member variable to a local variable in order to keep them thread-safe
UInt16 minForwardFilterDepth = mMinForwardFilterDepth;
UInt16 minReverseFilterDepth = mMinReverseFilterDepth;

// Determine the minimum filter depth based on whether we're going forward or backward
UInt16 minFilterDepth = SyMax(minForwardFilterDepth, minReverseFilterDepth);
minFilterDepth =
(
    mFilterArray[mCurrentPosition].mFrame
    +
    mFilterArray[mCurrentPosition - (1 << minFilterDepth)].mFrame
    -
    (mFilterArray[mCurrentPosition - (1 << minFilterDepth - 1)].mFrame << 1)
)
>=
0
?
minForwardFilterDepth
:
minReverseFilterDepth;

// Process filter levels from minFilterDepth to kMaxFilterDepth,
// and set currentFilterDepth depending on how fast the rate is changing
SyFilterPoint rate =
    mFilterArray[mCurrentPosition]
    +
    mFilterArray[mCurrentPosition - (1 << minFilterDepth)]
    -
    (mFilterArray[mCurrentPosition - (1 << minFilterDepth - 1)] << 1)
    >>
    2;
UInt16 currentFilterDepth = kMaxFilterDepth;
//#define _TRACE_RATE_COMPARE
//#define _TRACE_BAD_RATE
#if defined(_TRACE_RATE_COMPARE) || defined(_TRACE_BAD_RATE)
    Bool8 rateCompare[8] = {2, 2, 2, 2, 2, 2, 2, 2};
#endif
#ifdef _TRACE_BAD_RATE
    static UInt32 rateStability[8] = {0, 0, 0, 0, 0, 0, 0, 0};
#endif
    for (UInt16 i = minFilterDepth; i <= kMaxFilterDepth; i++)
    {
        mFilterRate[i] =
            mFilterArray[mCurrentPosition]
            +
            mFilterArray[mCurrentPosition - (1 << i)]
            -
            (mFilterArray[mCurrentPosition - (1 << i - 1)] << 1);
//
// The following rate compare adds the variance in frameSamplePeriod to the variance in the input
frame rate.
// If the variance in frameSamplePeriod is significant, rate should be calculated by dividing the
difference
// in frame numbers by the difference in sample numbers.
//
// Note that the compare never succeeds for i==minFilterDepth (i.e., the first loop iteration).
//
// !!! - We could probably make a tighter check by saving rate limits at each depth, so that every
shorter filter
//       could invalidate any longer filter, not just the next longer filter
//
#if defined(_TRACE_RATE_COMPARE) || defined(_TRACE_BAD_RATE)
        rateCompare[i - 1] = SY::abs((rate.mFrame << 2) - mFilterRate[i].mFrame) <= (kRatePrecisionThresho
ld << 1) >> 2;
```

```
#endif
#ifdef _TRACE_BAD_RATE
    if (i > minFilterDepth + 1)
    {
        if (!rateCompare[i - 1])
            rateStability[i - 1] = 0;
        else if (!rateCompare[i - 2] || rateStability[i - 1] != 0)
        {
            if (++rateStability[i - 1] >= 1 << i - 1)
            {
                SYRELTRACE(_T("****** virtual rate error:  minFilterDepth (now %d) should be at least %d ******\n"), minFilterDepth, i - 1);
                rateStability[i - 1] = 0;
            }
        }
    }
endif
    if
    (
        currentFilterDepth == kMaxFilterDepth
        &&
        SY::abs((rate.mFrame << 2) - mFilterRate[i].mFrame) > (kRatePrecisionThreshold << i) >> 2
    )
        currentFilterDepth = i - 1;
        rate = mFilterRate[i];
}
//
// Limit any increase in depth to prevent usage of a "stable" filter that actually
// has equal but opposite transients passing through it
//
if (1 << currentFilterDepth < mFilterDepthLimit)
#ifdef _TRACE_DEPTH_TRUNCATION
{
    if (1 << currentFilterDepth <= mFilterDepthLimit >> 1)
        SYTRACE
        (
            _T("Depth truncated:  curDepth=%d  limit=%d  rate[curDepth]<<16=0x%I64X - rate[curDepth+1]<<16=0x%I64X > 0x%I64X\n"),
            currentFilterDepth,
            mFilterDepthLimit,
            mFilterRate[currentFilterDepth].mFrame << 18 - (currentFilterDepth << 1),
            mFilterRate[currentFilterDepth+1].mFrame << 16 - (currentFilterDepth << 1),
            kRatePrecisionThreshold << 15 - currentFilterDepth
        );
#endif
    mFilterDepthLimit = 1 << currentFilterDepth;
#ifdef _TRACE_DEPTH_TRUNCATION
}
endif
    while (1 << currentFilterDepth > mFilterDepthLimit)
        currentFilterDepth--;
    if (mFilterDepthLimit < 1 << kMaxFilterDepth)
        mFilterDepthLimit++;

//#define _TRACE_INPUT_DELTA
#ifdef _TRACE_RATE_COMPARE
    SYRELTRACE(_T("RC:  %d%d%d%d%d%d%d%d"),
        rateCompare[0], rateCompare[1], rateCompare[2], rateCompare[3],
        rateCompare[4], rateCompare[5], rateCompare[6], rateCompare[7]);
#ifndef _TRACE_INPUT_DELTA
    SYRELTRACE(_T("\n"));
#else
    SYRELTRACE(_T(" "));
#endif
#endif
#ifdef _TRACE_INPUT_DELTA
    rate = mFilterArray[mCurrentPosition] + mFilterArray[mCurrentPosition - 2] - (mFilterArray[mCurrentPosition - 1] << 1);
    SYRELTRACE(_T("FFN:  F=%I64d  S=%I64d\n"), rate.mFrame, rate.mSample);
#endif
#ifdef _TRACE_BAD_RATE
    static Bool8 lastDeepCompare;
    if (lastDeepCompare && !rateCompare[kMaxFilterDepth - 1])
    {
        SYRELTRACE(_T("****** real rate change:  minForwardFilterDepth = %d, minReverseFilterDepth = %d ******\n"),
            mMinForwardFilterDepth, mMinReverseFilterDepth);
    }
    lastDeepCompare = rateCompare[kMaxFilterDepth - 1];
endif // Every kDecimate passes, send a filter point to the frame tracker
    if (++mPass == kDecimate)
    {
        mFilterPipe.PutItem
```

```
            (
                SyFilterPipeItem
                (
                    mCorrectForFilterDelay
                    ?
                    mFilterArray[mCurrentPosition]
                    -
                    mFilterArray[mCurrentPosition - (1 << currentFilterDepth)]
                    +
                    (mFilterRate[currentFilterDepth] << 1)
                    >>
                    currentFilterDepth
                    :
                    mFilterArray[mCurrentPosition]
                    -
                    mFilterArray[mCurrentPosition - (1 << currentFilterDepth)]
                    >>
                    currentFilterDepth,
                    mFilterRate[currentFilterDepth] * kDecimate >> (currentFilterDepth - 1 << 1)
#if defined(_DEBUG) || defined(NDEBUG)
                    ,
                    currentFilterDepth,
                    mCurrentPosition
#endif
                )
            );
#ifdef _TRACE_PIPE_INPUT
        SyFilterPipeItem pi
            (
                mCorrectForFilterDelay
                ?
                mFilterArray[mCurrentPosition]
                -
                mFilterArray[mCurrentPosition - (1 << currentFilterDepth)]
                +
                (mFilterRate[currentFilterDepth] << 1)
                >>
                currentFilterDepth
                :
                mFilterArray[mCurrentPosition]
                -
                mFilterArray[mCurrentPosition - (1 << currentFilterDepth)]
                >>
                currentFilterDepth,
                mFilterRate[currentFilterDepth] * kDecimate >> (currentFilterDepth - 1 << 1)
            );
        SYTRACE(_T("PI:  F=%I64d  S=%I64d  RF=%I64d  RS=%I64d  depth=%d  curPos=%d\n"),
            pi.mFrame, pi.mSample, pi.mRate.mFrame, pi.mRate.mSample, currentFilterDepth, mCurrentPosition);
#endif
        mPass = 0;
    }

// Store the filter point again, since the array size has been doubled to simplify indexing
    mFilterArray[mCurrentPosition - (1 << kMaxFilterDepth)] = mFilterArray[mCurrentPosition - 1] + filter
        Point;

// Move to the next position in the filter array
    mCurrentPosition++;
    mCurrentPosition &= (1 << kMaxFilterDepth) - 1;
    mCurrentPosition |= 1 << kMaxFilterDepth;
} void SyNewRateControl::TrackFrames
(
    SyFilterPipeItem& newFilterPoint,   // newFilterPoint is an input to the function, all following args
        are outputs
    IEEE32& currentRate,
    IEEE32& newRate,
    TimeCode& position,
    TimeStamp& rateTimeStamp,
    TimeStamp& commandTimeStamp
)
{
    // This is the frame tracker, which calculates the rates and timestamps needed by the transport contr
        oller
    commandTimeStamp = this->GetReferenceTime();
    rateTimeStamp = commandTimeStamp;
    if (rateTimeStamp < mCueTimeStamp)
        rateTimeStamp = mCueTimeStamp;
    _ASSERT((Int32)newFilterPoint.mRate.mSample > 0);
    TimeStamp nextRateTimeStamp = commandTimeStamp + (TimeStamp)newFilterPoint.mRate.mSample;
    currentRate = (IEEE32)(newFilterPoint.mRate.mFrame) / newFilterPoint.mRate.mSample;
    //SYTRACE(_T("cr: %f, mFrame: %I64d, mSample: %I64d\n"), (float) currentRate,
    // newFilterPoint.mRate.mFrame, newFilterPoint.mRate.mSample);
    ::SyEnterCriticalSection(&mTransportCS);
```

```
    position = mActualPosition + mLastActualRate * (rateTimeStamp - mLastActualRateTimeStamp);
    ::SyLeaveCriticalSection(&mTransportCS);
    TimeCode desiredNextPosition = newFilterPoint.mFrame + (TimeCode)(currentRate * (nextRateTimeStamp -
        (TimeStamp)newFilterPoint.mSample));
    newRate = (IEEE32)(desiredNextPosition - position) / (nextRateTimeStamp - rateTimeStamp);
} void SyNewRateControl::ControlTransport
(
    SyFilterPipeItem newFilterPoint,
    IEEE32 currentRate,
    IEEE32 newRate,
    TimeCode position,
    TimeStamp rateTimeStamp,
    TimeStamp commandTimeStamp
)
{
    // Find out where we should be and how far that is from where we are
    TimeCode desiredPosition = newFilterPoint.mFrame + (TimeCode)(currentRate * (rateTimeStamp - (TimeSta
        mp)newFilterPoint.mSample));
    TimeDelta error = SY::abs(desiredPosition - position);

// Limit rate to what the transport can handle
    if (newRate > kMaxRate)
        newRate = kMaxRate;
    if (newRate < -kMaxRate)
        newRate = -kMaxRate;

// Copy member variables to local variables for thread protection
    Int16 forwardSyncLockDelay = mForwardSyncLockDelay;
    Int16 reverseSyncLockDelay = mReverseSyncLockDelay;

// If the rate is close enough to +/- 1.0, assume it is exactly +/- 1.0
    if
    (
        newRate > 1.0 - kRateTolerance &&
        newRate < 1.0 + kRateTolerance &&
        error < kMaxUnityError
    )
    {
        if (forwardSyncLockDelay == INFINITE_SYNCLOCK_DELAY)
            mUnityRateTimer = 0;
        else if (mUnityRateTimer < forwardSyncLockDelay)
        {
            // Use a tighter rate window before actually locking into play speed
            if
            (
                (
                    newRate > 1.0 - kRateTolerance / 8 &&
                    newRate < 1.0 + kRateTolerance / 8 &&
                    error < kMaxUnityError / 8
                )
            )
                mUnityRateTimer++;
        }
        else
            newRate = 1.0;
    }
    else if
    (
        newRate < -1.0 + kRateTolerance &&
        newRate > -1.0 - kRateTolerance &&
        error < kMaxUnityError
    )
    {
        if (reverseSyncLockDelay == INFINITE_SYNCLOCK_DELAY)
            mUnityRateTimer = 0;
        else if (mUnityRateTimer > reverseSyncLockDelay)
        {
            // Use a tighter rate window before actually locking into reverse play speed
            if
            (
                (
                    newRate < -1.0 + kRateTolerance / 8 &&
                    newRate > -1.0 - kRateTolerance / 8 &&
                    error < kMaxUnityError / 8
                )
            )
                mUnityRateTimer--;
        }
        else
            newRate = -1.0;
    }
    else
        mUnityRateTimer = 0;
```

```
#ifdef _TRACE_OUTPUT_DELTA
    static SyFilterPipeItem lastFilterPoint;
    SYRELTRACE
    (
        _T("FPD:  F=%I64d  S=%I64d\n"),
        newFilterPoint.mFrame - lastFilterPoint.mFrame,
        newFilterPoint.mSample - lastFilterPoint.mSample
    );
    SYRELTRACE
    (
        _T("FRD:  F=%I64d  S=%I64d\n"),
        newFilterPoint.mRate.mFrame - lastFilterPoint.mRate.mFrame,
        newFilterPoint.mRate.mSample - lastFilterPoint.mRate.mSample
    );
    lastFilterPoint = newFilterPoint;
#endif
#if defined(_DEBUG) || defined(NDEBUG)
//#define _TRACE
#ifdef _TRACE
    SYRELTRACE
    (
        _T("CT:   fp=%I64u,%I64u  fr=%I64d,%I64d  curRate=%f  newRate=%f  pos=%I64d  rateTS=%lu  cmdTS=%lu\
n"),
        newFilterPoint.mFrame,
        newFilterPoint.mSample,
        newFilterPoint.mRate.mFrame,
        newFilterPoint.mRate.mSample,
        currentRate,
        newRate,
        position,
        rateTimeStamp,
        commandTimeStamp
    );
    SYRELTRACE
    (
        _T("      actPos=%lf  desPos=%I64u  error=%s%I64d  depth=%d  curPos=%d\n"),
        mActualPosition,
        desiredPosition,
        position > desiredPosition ? _T("-") : _T(""),
        error,
        newFilterPoint.mDepth,
        newFilterPoint.mPosition
    );
#endif
#endif
    // If the error is more than kMaxChaseError and the rate is maxed out, cue the transport
    if
    (
        error > kMaxChaseError && SY::abs(newRate) == kMaxRate
        ||
        this->CueHint(currentRate) & ~mCueHint
    )
    {
        mCueHint = this->CueHint(currentRate);
        TimeStamp cueDelay = this->GetCueDelay() << (int) (mCueHint == CUEHINT_BIDIRECTIONAL);
        if ((Int32)cueDelay < newFilterPoint.mRate.mSample)
            cueDelay = newFilterPoint.mRate.mSample;
        mCueTimeStamp = commandTimeStamp + cueDelay;
        newRate = 0.0;
        if (newRate != mLastActualRate)
            this->SetTransportRate(newRate, commandTimeStamp);
        //SYTRACE(_T("nfp.mFrame: %I64d, cr: %f, cts: %d, nfp.mSample: %I64d\n"),
        // newFilterPoint.mFrame, (float) currentRate, (Int32) mCueTimeStamp,
        // newFilterPoint.mSample);
        position = newFilterPoint.mFrame + (TimeCode)(currentRate * (mCueTimeStamp - (TimeStamp)newFilterP
oint.mSample));
        if (SY::abs(currentRate) <= kMaxRate)
            this->CueTransport(position, commandTimeStamp, mCueHint);
        else
        {
            // The following call to Cue used to be called to handle the case
            // where CalculateRate wasn't called for a long time. However,
            // it could cause the rate controller to get out of sync with
            // the transports it is controlling.
            // Set position just to keep mActualPosition and mLastActualRateTimeStamp reasonable
            //this->Cue(position, commandTimeStamp);

// Clear mCueHint to force a cue before any new rates are sent
            mCueHint = 0;
        }
        mCuePosition = position;
    }
    // Otherwise, if we're not cueing, set the transport rate
    else if ((TimeStamp)(commandTimeStamp + (TimeStamp)newFilterPoint.mRate.mSample) >= mCueTimeStamp)
```

```
        {
            Bool32 lock
                =
                (
                    mUnityRateTimer == forwardSyncLockDelay || mUnityRateTimer == reverseSyncLockDelay
                )
                &&
                SY::abs(newRate) == 1.0;
            if (newRate != mLastActualRate || lock != mLastActualLock)
                this->SetTransportRate(newRate, rateTimeStamp, lock);
            mCueTimeStamp = rateTimeStamp;
            if (mCueHint != CUEHINT_BIDIRECTIONAL)
            {
                Int32 cueDelay = this->GetCueDelay();
                if (position >= mCuePosition + cueDelay)
                    mCueHint |= CUEHINT_BACKWARD;
                else if (position <= mCuePosition - cueDelay)
                    mCueHint |= CUEHINT_FORWARD;
            }
        }
    }
} void SyNewRateControl::SetRate(IEEE32 rate, TimeStamp timeStamp, Bool32 lock)
{
    ::SyEnterCriticalSection(&mTransportCS);
    mActualPosition += mLastActualRate * (timeStamp - mLastActualRateTimeStamp);
    //SYTRACE(_T("SR MAP %f\n"), (float) mActualPosition);
    mLastActualRate = rate;
    mLastActualRateTimeStamp = timeStamp;
    mLastActualLock = lock;
    ::SyLeaveCriticalSection(&mTransportCS);
#ifdef _TRACE
    TimeStamp cur = this->GetReferenceTime();
    SYRELTRACE(_T("SetRate(%f, %lu, %d), cur=%lu, delta=%ld\n"), rate, timeStamp, lock, cur, timeStamp - cur);
#endif
} void SyNewRateControl::Cue(TimeCode time, TimeStamp timeStamp)
{
    ::SyEnterCriticalSection(&mTransportCS);
    mActualPosition = time;
    //SYTRACE(_T("Cue MAP: %f\n"), (float) mActualPosition);
    mLastActualRateTimeStamp = timeStamp;
    ::SyLeaveCriticalSection(&mTransportCS);
#ifdef _TRACE
    TimeStamp cur = this->GetReferenceTime();
    SYRELTRACE(_T("Cue(%I64d, %lu), cur=%lu, delta=%ld\n"), time, timeStamp, cur, timeStamp - cur);
#endif
} void SyNewRateControl::UpdateForwardSyncLockDelay(UInt32 forwardSyncLockDelay)
{
    if (forwardSyncLockDelay == INFINITE)
        mForwardSyncLockDelay = INFINITE_SYNCLOCK_DELAY;
    else
    {
        UInt32 syncLockDelay = (forwardSyncLockDelay + (kFrameSamplePeriod * kDecimate >> 1)) / (kFrameSamplePeriod * kDecimate);
        mForwardSyncLockDelay = syncLockDelay > 0x7FFF ? 0x7FFF : syncLockDelay;
    }
#ifdef _TRACE
    SYRELTRACE(_T("mForwardSyncLockDelay set to %d\n"), mForwardSyncLockDelay);
#endif
} void SyNewRateControl::UpdateReverseSyncLockDelay(UInt32 reverseSyncLockDelay)
{
    if (reverseSyncLockDelay == INFINITE)
        mReverseSyncLockDelay = INFINITE_SYNCLOCK_DELAY;
    else
    {
        UInt32 syncLockDelay = (reverseSyncLockDelay + (kFrameSamplePeriod * kDecimate >> 1)) / (kFrameSamplePeriod * kDecimate);
        mReverseSyncLockDelay = syncLockDelay > 0x7FFF ? -0x7FFF : -syncLockDelay;
    }
#ifdef _TRACE
    SYRELTRACE(_T("mReverseSyncLockDelay set to %d\n"), mReverseSyncLockDelay);
#endif
} void SyNewRateControl::UpdateForwardFilterLength(UInt32 minForwardFilterLength)
{
    UInt32 twoToTheMinFilterDepthMinusTwo = (mFrameUpdatePeriod + minForwardFilterLength) / kFrameSamplePeriod;
```

```
    for
    (
        UInt16 minForwardFilterDepth = 1;   // For thread protection, use a local variable while calculati
            ng filter depth
        twoToTheMinFilterDepthMinusTwo != 0 && minForwardFilterDepth < kMaxFilterDepth;
        twoToTheMinFilterDepthMinusTwo >>= 1, minForwardFilterDepth++
    )
    ;
    mMinForwardFilterDepth = minForwardFilterDepth > kMaxFilterDepth ? kMaxFilterDepth : minForwardFilter
        Depth;
#ifdef _TRACE
    SYRELTRACE(_T("mMinForwardFilterDepth set to %d\n"), mMinForwardFilterDepth);
#endif
} void SyNewRateControl::UpdateReverseFilterLength(UInt32 minReverseFilterLength)
{
    UInt32 twoToTheMinFilterDepthMinusTwo = (mFrameUpdatePeriod + minReverseFilterLength) / kFrameSampleP
        eriod;
    for
    (
        UInt16 minReverseFilterDepth = 1;   // For thread protection, use a local variable while calculati
            ng filter depth
        twoToTheMinFilterDepthMinusTwo != 0 && minReverseFilterDepth < kMaxFilterDepth;
        twoToTheMinFilterDepthMinusTwo >>= 1, minReverseFilterDepth++
    )
    ;
    mMinReverseFilterDepth = minReverseFilterDepth > kMaxFilterDepth ? kMaxFilterDepth : minReverseFilter
        Depth;
#ifdef _TRACE
    SYRELTRACE(_T("mMinReverseFilterDepth set to %d\n"), mMinReverseFilterDepth);
#endif
}

SyNewRateControl::FilterPipe::FilterPipe(UInt32 length) :
    SySigPipe<SyFilterPipeItem>
    (
        length,
        new SyNullMutex,
        new SyNullMutex,
        new SySemaphoreSemaphore(length, length),
        new SySemaphoreSemaphore(0, length)
    )
{
}

SyNewRateControl::FilterPipe::~FilterPipe(void)
{
    delete this->EmptySemaphore();
    delete this->FullSemaphore();
    delete this->SinkMutex();
    delete this->SourceMutex();
}
```

What is claimed is:

1. A filter, the length of which is dynamically variable responsive to a moving average of variations in an input rate to a system for processing audio samples, comprising:

a circular buffer which includes a plurality of positions for storing audio sample values during iterations iteration of the processing system;

means for adding an audio sample to the buffer upon each iteration of the processing system;

means for generating an audio sample value for each position in the circular buffer upon each iteration of the processing system, wherein the audio sample value comprises the sum of the audio sample added to the position and the audio sample stored in the prior position;

means for generating a calculated average of the plurality of audio sample values stored in the positions in the buffer; and means for changing the length of the filter responsive to the calculated average.

2. The system of claim 1, wherein the calculated average comprises the average of the last N audio sample values in the buffer.

3. The system of claim 1, wherein the system further comprises means for controlling the motion of an audio transport responsive to an audio input from the motion of an audio source and an audio output to the audio transport derived from the audio input, wherein the motion of the audio source generates the audio samples for the circular buffer.

4. A method of changing the length of a filter responsive to the audio samples generated by audio source motion in a system for processing audio samples, wherein the filter comprises a circular buffer which includes a plurality of positions for storing audio sample values during iteration of the processing system, means for adding an audio sample to the buffer upon each iteration of the processing system, means for generating an audio sample value for each position in the circular buffer upon each iteration of the processing system, wherein the audio sample value comprises the sum of the audio sample value added to the position and the audio sample stored in the prior position, means for generating a calculated average of the plurality of audio sample values stored in the positions in the buffer, and means for changing the length of the filter responsive to the calculated average, the method comprising the steps of:

activating the adding means to add an audio sample to the buffer upon each iteration of the processing system;

activating the calculated value generating means to calculate the average of the plurality of audio sample values in the buffer positions; and activating the filter length changing means to change the length of the filter responsive to the calculated average audio sample value.

5. The method of claims 4, wherein the calculated average comprises the average of the last N audio sample values in the buffer, and the step of generating a calculated average comprises generating a calculated average of the last N audio sample values stored in the positions in the buffer.

6. The method of claim 4, wherein the system further comprises means for controlling the motion of an audio transport responsive to an audio input from the motion of an audio source and an audio output to the audio transport derived from the audio input, wherein the motion of the audio source generates the audio samples for the circular buffer, further comprising the steps of activating the audio input to generate the audio samples for the circular buffer and controlling the motion of the audio transport responsive to the audio input and audio output.

* * * * *

UNITED STATES PATENT AND TRADEMARK OFFICE
CERTIFICATE OF CORRECTION

PATENT NO. : 6,012,031
DATED : Jan. 4, 2000
INVENTOR(S) : Richard J. Oliver, Paul M. Embree, Casper William Barnes It is certified that error appears in the above-identified patent and that said Letters Patent is hereby corrected as shown below:

Column 3, line 6, change "sample", to read --samples--.

Column 33, line 6, claim 1, after" iterations", delete "iteration".

Signed and Sealed this

Eighth Day of August, 2000

Attest:

Q. TODD DICKINSON

*Attesting Officer*  *Director of Patents and Trademarks*